METHOD OF FORMING A METAL CONTACT ON A SEMICONDUCTOR DEVICE

Filed Sept. 18, 1964 2 Sheets-Sheet 1

June 11, 1968 W. P. WATERS ETAL 3,388,000

METHOD OF FORMING A METAL CONTACT ON A SEMICONDUCTOR DEVICE

Filed Sept. 18, 1964 2 Sheets-Sheet 2

United States Patent Office 3,388,000

Patented June 11, 1968

3,388,000

METHOD OF FORMING A METAL CONTACT ON A SEMICONDUCTOR DEVICE

Warren P. Waters, Dallas, and Byron K. Lovelace, Georgetown, Tex., assignors to Texas Instruments Incorporated, Dallas, Tex., a corporation of Delaware Filed Sept. 18, 1964, Ser. No. 397,413

8 Claims. (Cl. 117—212)

ABSTRACT OF THE DISCLOSURE

Disclosed is a method of forming a planar Schottky barrier having a very small area metal contact to a surface of a semiconductor substrate by overlapping openings, one opening being formed in each of two insulating layers, the second insulating layer being formed on the first insulating layer, and by depositing a metal film on the portion of the substrate exposed by the two openings.

The present invention relates to microcircuit fabrication, and more particularly, but not by way of limitation, to a process for fabricating a high-frequency metal-semiconductor junction diode suitable for use in high-frequency mixer circuits and the like and to a novel diode construction.

Metal-semiconductor diodes, which are known in the art as Schottky barriers, are commonly used in high-frequency circuits such as, for example, in the mixers of radar systems. The most conventional Schottky barrier construction employs a springlike metal whisker having a very small flat tip which is pressed against the surface of the semiconductor crystal. The contacting surfaces between the metal and semiconductor provide the metal-semiconductor diode junction. This type of construction is suitable for high-frequency applications because the area of the barrier formed between the metal and the semiconductor can be made very small and the opposed area of the conductor adjacent to the barrier is only equal to the cross-sectional area of the whisker so that the stray capacitance of the diode is held to a minimum. Attempts to fabricate high-frequency radar systems and the like in totally integrated circuit form have not been heretofore seriously considered because of the difficulties inherent in fabricating high-frequency diodes in integrated circuit form.

Therefore, an important object of the present invention is to provide a Schottky barrier suitable for use in a high-frequency mixer circuit or the like which is fabricated on a semiconductor substrate.

Another object of the invention is to provide a process for fabricating a planar Schottky barrier having a very small junction area between the metal and the semiconductor.

A further object of the invention is to provide a process for producing a very small aperture in an insulating layer deposited over a substrate so that a small contact area between the substrate and a subsequently deposited layer may be obtained.

A further object of the invention is to provide a process for producing an aperture in an insulating film over a substrate which is progressively larger in cross-sectional area so that a metal contact may be deposited uniformly over the portion of the substrate exposed by the aperture by evaporation without shadowing from the sides of the aperture.

These and other objects are accomplished by the process which comprises depositing a first insulating film on the substrate, forming a first aperture in the layer to expose a small area of the substrate, depositing a second insulating layer over the first insulating layer and over the exposed area of the substrate, the second layer having a more rapid etch rate in a particular etchant fluid than the first layer, and selectively etching an area of the second layer which at least partially overlaps the previously exposed area so as to again expose the substrate in the overlapping area.

In accordance with a more specific aspect of the invention, the aperture formed in the first insulating layer is an elongated aperture of minimum width corresponding approximately to the desired diameter of the final aperture, and the aperture formed in the second layer is also elongated and is substantially the same width and intersects the first elongated aperture whereby the substrate is exposed only in the area common to both apertures.

In accordance with another more specific aspect of the invention, the first insulating layer is aluminum trioxide ($Al_2O_3$) and the second insulating layer is silicon dioxide ($SiO_2$). A metal film is then deposited on the exposed surface of the substrate and over a sufficient portion of the second layer to form a contact area.

A metal-semiconductor junction diode is thus formed which is comprised of a single crystal semiconductor body, a layer of insulating material disposed over the surface of the semiconductor body having an aperture exposing a small area of the semiconductor, and a body of metal bonded to the insulating layer and extending through the aperture into contact with the surface of the semiconductor. Contact can be made with the semiconductor substrate by means of a highly-doped region and a metal film alloyed to the highly-doped region, or by other suitable means.

Additional aspects, objects and advantages of the invention will be evident from the following detailed description of preferred embodiments of the invention when read in conjunction with the accompanying drawings, wherein.

Figures 1, 2, 6:
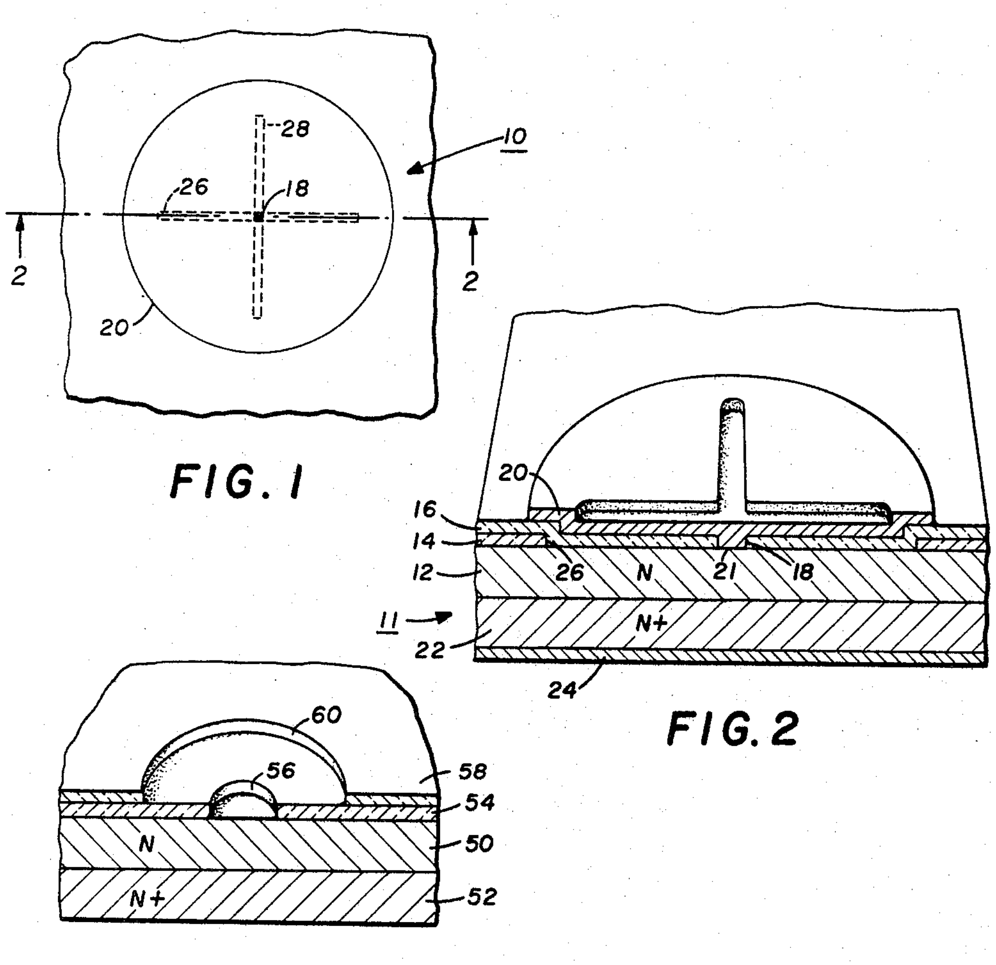
FIGURE 1 is a schematic top view of a metal-semiconductor junction diode constructed in accordance with the present invention with details of construction illustrated in dotted outline.
FIGURE 2 is a schematic perspective view taken in section substantially along lines 2—2 of FIGURE 1.
FIGURE 6 is a schematic perspective view taken in section which serves to illustrate another aspect of the present invention.

Referring now to the drawings, a metal-semiconductor junction diode constructed in accordance with the present invention is indicated generally by the reference numeral 10. As can best be seen in the sectional view of FIGURE 2, the diode 10 is comprised of a substrate 11 having a lightly-doped semiconductor region 12 onto which successive insulating layers 14 and 16 have been deposited. A small aperture 18 extends through both of the insulation layers. A metal film 20 has been deposited on the surface of the insulating layer 16 and extends through the aperture 18 into intimate contact with the surface of the semiconductor body 12 to form a metal-semiconductor junction 21 and one of the terminals for the diode. The substrate 11 also has a highly-doped semiconductor region 22 to which a metal film 24 is alloyed to provide the other terminal for the diode.

The aperture 18 and therefore the junction area 21 between the metal 20 and semiconductor 12 is very small so that the diode may be used in high-frequency applications. Further, the combined thickness of the insulating layers 14 and 16 may be appreciable such that the capacitance between the metal film 20 and the semiconductor region 12 is reduced to a minimum. The semiconductor substrate may be germanium, silicon, gallium arsenide, or any other suitable semiconductor. As illustrated, the semiconductor region 12 is lightly doped with N-type material, while the region 22 is heavily doped with N-type material to make a more highly conductive terminal for the device. The insulating layers 14 and 16 may be any suitable material, but preferably are $Al_2O_3$ and $SiO_2$, respectively, for purposes which will hereafter be described. The metal terminals 20 and 24 may be gold, molybdenum-gold, aluminum, or other suitable metal. The small aperture 18 is formed at the intersection of elongated slots 26 and 28, indicated in dotted outline in FIGURE 1, which are etched in the insulating layers 14 and 16 by means of the process of the present invention which will now be described, and may be as small as necessary in order to obtain the desired high-frequency characteristics. For example, the slots may be as narrow as one micron.

Figure 3:
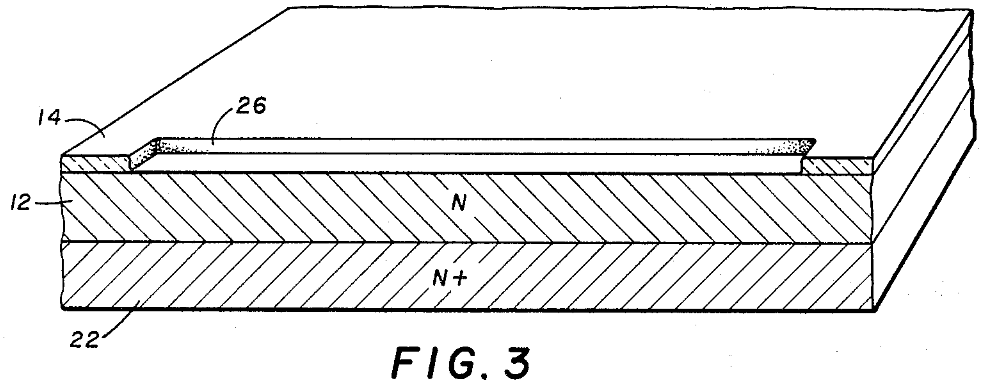
FIGURE 3 is a schematic sectional view which serves to illustrate the method of the present invention.

Referring now to FIGURE 3, the lightly-doped semiconductor region 12 may be epitaxially grown on the more heavily-doped region 22 by conventional techniques, or the two zones may be formed by diffusing a dopant into a single crystal substrate. As previously mentioned, the purpose of the heavily-doped region 22 is to provide good electrical contact between the metal film 24 (shown in FIGURES 2 and 5) and the lightly-doped semiconductor region 12. The insulating layer 14 is formed over the entire surface of the semiconductor region 12 using any conventional technique and material such as silicon dioxide ($SiO_2$). However, in accordance with one specific aspect of the invention, the first insulating layer 14 is aluminum trioxide ($Al_2O_3$) which may be deposited on the surface of the substrate by reactive sputtering or other suitable technique. The aluminum trioxide is an amorphous layer and may be deposited and annealed at about 480° C., for example.

After the insulating layer 14 has been deposited, an elongated strip 26 of the layer is selectively removed so as to expose an elongated area of the surface of the semiconductor substrate 12. This may be accomplished by first coating the insulating layer 14 with a photo-resist material such as one of the Kodak resists designated KMER or KTFR, the latter being preferred. Next a photomask is placed in contact with the surface of the photoresist film. Due to the thickness of the photomask, the location of the opaque portions of the photomask relative to the surface of the resist, and the wavelength of the exposing light, the light tends to be refracted around any opaque portion of the photomask. This prevents accurately exposing the photo-resist around a very small dot. However, defraction of the exposing light is of concern only in one direction around an opaque line on the mask so that the width of a strip of the photo-resist masked from exposure can be controlled with considerable accuracy. The masked and unexposed area of the photo-resist is then removed by a developing solution to expose the surface of the oxide insulating film 14 in the elongated area 26. Using this technique, it is possible to remove a strip of the photo-resist approximately one micron in width, while the length of the strip removed might be as much as 3.0 mils. After the strip of the photo-resist is removed by developing, the substrate is subjected to a suitable etchant fluid, such as hydrofluoric acid, and the portion of the oxide film 14 which is not protected from the etchant by the photo-resist is selectively removed to form the elongated slot 26, and expose an area of the substrate approximately the same size as the strip of photo-resist removed, i.e., approximately one micron in width and approximately 3 mils in length. The remaining photo-resist material is then stripped from the surface of the oxide insulating layer 14.

The second insulating layer 16 (shown in FIGURE 4) is then deposited over the surface of the first insulating layer 14 and over the exposed surface of the semiconductor region 12. In accordance with an important aspect of the invention, the second insulating layer 16 has a substantially greater etch rate in a given etchant fluid than does the first insulating layer 14. For example, when the insulating layer 14 is fabricated from aluminum trioxide, the second layer 16 might be fabricated from silicon dioxide. The aluminum trioxide has an etch rate of approximately 20 A./sec., while the silicon dioxide has an etch rate of approximately 90 A./sec. if deposited or annealed at 420° C. If the silicon dioxide is deposited or annealed at a higher temperature, a lower etch rate is obtained, while the etch rate of aluminum trioxide does not change appreciably with formation temperature.

Figure 4:
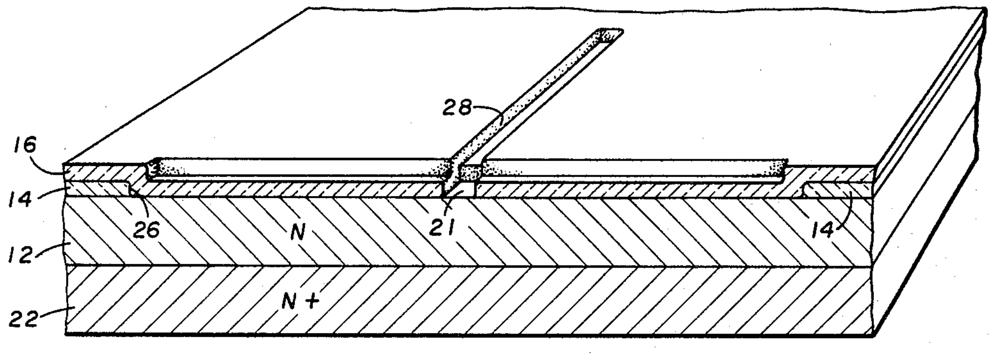
FIGURE 4 is a schematic sectional view similar to FIGURE 3 which serves to further illustrate the method of the present invention.
Figure 5:
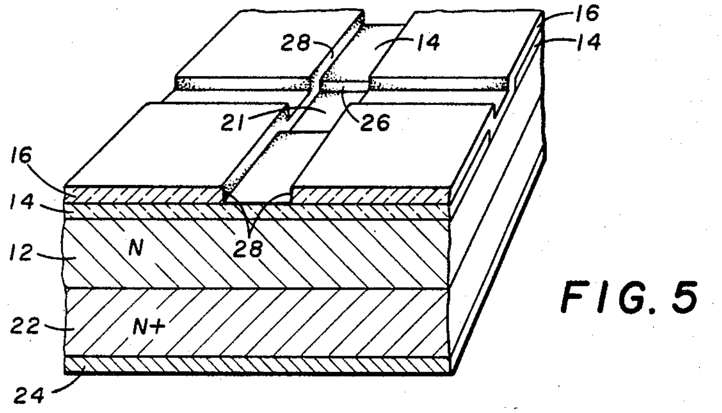
FIGURE 5 is a schematic perspective view, broken away to better illustrate the details of construction of the diode of FIGURE 1.

Next a coat of photo-resist is deposited on the second insulating layer 16 and exposed in all areas except for an elongated area corresponding to the slot 28. Then when the photo-resist is developed, the second insulating layer 16 is exposed in the area of the slot 28, and when subjected to the fluid etchant, such as hydrofluoric acid, is selectively removed to form the slot 28. Since the second insulating layer 16 of silicon dioxide etches at over four times the rate of the first insulating layer 14 of aluminum trioxide, the semiconductor substrate 12 will be exposed in the junction area 21 without danger of also being exposed in another area as a result of uncontrolled etching of the first layer 14 during the second etching step. This is a danger because when chemical etching is confined to the very small well formed at the intersection of the two slots, the rate at which the dissolved oxide is carried away decreases, the concentration of oxide in the etchant increases, and the etching rate decreases. After a portion of the second insulating layer 16 has been removed by the etchant in the desired area, the surface of the substrate will again be exposed in the area 21. The remaining photo-resist is then removed by a suitable stripping fluid. An enlarged view of the junction 21 portion of FIGURE 4 is shown in FIGURE 5.

A so-called negative resist has been heretofore described in connection with the process of this invention. When using a negative resist, the exposed portion of the material is polymerized and the unexposed portion is removed by development to form the slot through which the oxide is etched. However, it is to be understood that a positive resist could also be used, in which case the exposed portion is de-polymerized and removed by the developing solution. In such a case the narrow slot in the resist may be exposed by light or by an electron beam, and the process carried out as previously described.

In accordance with another aspect of the invention, the insulating layers 14 and 16 may be of the same material, preferably silicon dioxide. In this case, the duration of the etching step of the second insulating layer 16 must be closely controlled to insure that only the second layer 16 is removed and that the first layer 14 is not cut through because if the substrate is exposed by spurious etching of the first layer, the device may be shorted. The etch period may be calculated by measuring the thickness of the second insulating layer and determining the etch rate of the oxide in the particular etchant solution experimentally.

Next a metal film is deposited by a conventional technique such as evaporation and condensation over the surface of the second insulating layer 16, and extends through the slot 28 onto the exposed portion of the first insulating layer 14 and through the aperture 18 formed at the intersection of the slots 26 and 28 onto the junction area 21. The excess metal is then selectively removed to leave the metal forming the terminal 20 and the metal-semiconductor junction 21 as shown in FIGURE 2. A metal film may also be deposited on the other side of the substrate to form the terminal 24 (also shown in FIGURES 2 and 5).

As described, the contact between the metal terminal 20 and the exposed portion of the semiconductor region 12 was produced by a metal film deposited on the surface of the insulating layers. This is the preferred construction for integrated circuit application. However, metal can be made to contact the semiconductor to form the metal-semiconductor junction by any suitable means for other applications. For example, the metal spring-whisker used in conventional Schottky barrier diodes could be passed through the aperture 18 into contact with the surface of the semiconductor region. The edges of the insulating layers 14 and 16 forming the aperture 18 would then tend to hold the whisker in place such that it would not be as susceptible to vibration.

In one embodiment of the invention, the slots 26 and 28 were formed approximately 0.1 mil in width and approximately 3 mils in length. This resulted in a junction area 21 of approximately 0.01 square mil. The use of two separate insulation layers 14 and 16 of different etching rates insures that only the junction area 21 will be exposed by the etching process. Further, the walls of the aperture 18 are only a single layer high. This is important because when metal is deposited by evaporation, the metal atoms travel in a straight line to the surface on which they collect. The low sides of the aperture 18 reduce the shadowing effect of the walls of the aperture to a minimum and permit a uniform metal-semiconductor junction to be formed. Yet the major part of the metal of the terminal 20 is spaced from the semiconductor region 12 by a double thickness of insulation so as to reduce the stray capacitance by a very significant value, even though the terminal area is as much as 5 mils in diameter, so that a whisker lead wire or strip line conductor may be connected to the terminal.

Figure 7:
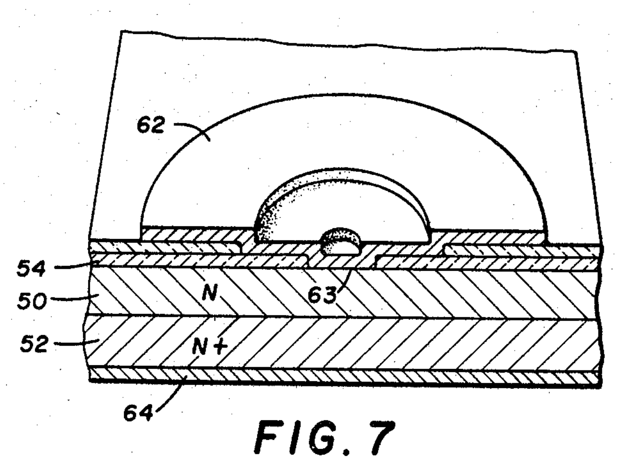
FIGURE 7 is a schematic perspective view similar to FIGURE 6 with a metal contact in place.

Another aspect of the present invention is illustrated in FIGURES 6 and 7 wherein a small area of a semiconductor substrate is exposed by an aperture through an overlayer. The aperture has a progressively increasing cross section to permit deposition of a material on the exposed surface of the substrate so as to form a diode or the like. Thus, as illustrated in FIGURE 6, a substrate has a lightly-doped semiconductor region 50 disposed adjacent a heavily-doped region 52 as previously described. A first insulating layer 54, such as aluminum trioxide, is deposited on the surface of the substrate. A small aperture 56 is then formed in the insulating layer 54 by a photo-resist technique such as previously described, or by an electron beam or some mechanical means. Then the second insulating layer 58 is deposited over the first layer 54 and over the portion of the substrate exposed by the aperture 56. The second insulating layer is a material having a greater rate of etch than the first insulating layer 54 in a particular etchant. For example, the first layer 54 may be $Al_2O_3$, the second layer $SiO_2$, and the etchant fluid HF acid. Then a larger aperture 60 is etched in the second layer 58 using a photo-resist technique such as heretofore described. Since the second insulating layer 58 etches at a considerably greater rate than the first insulating layer 54, the portion of the second layer which is deposited within the first aperture 56 will be thoroughly removed even though the rate of removal is lessened by reason of its physical location in the small aperture. After the apertures 56 and 60 are formed, a metal film may be deposited on the exposed surfaces of the insulating layers and substrate to form a metal-semiconductor junction 63 and the metal terminal 62 as shown in FIGURE 7. A metal layer may also be deposited on the highly-doped region 52 of the substrate to provide a terminal 64 and complete a Schottky barrier diode as heretofore described.

From the above detailed description of preferred embodiments of the invention, it will be evident that a planar metal-semiconductor junction diode has been described which may be fabricated in integrated circuit form. The metal region, the semiconductor region, and the insulating region are integrally bonded to provide improved resistance to mechanical shock. Further, the diode may be fabricated as an integral part of an integrated circuit and the junction area between the metal and the semiconductor material may be made sufficiently small to provide satisfactory operation at very high frequencies. This is made possible by reason of the fact that the junction area is very small, yet the relatively large terminal areas of the diode are separated by an insulator of substantial thickness. The process provides a means whereby a very small aperture may be formed in a relatively thick insulating layer disposed on a semiconductor substrate. The aperture has sloping sides so that metal can be evaporated on the exposed surface of the substrate without adverse shadow effects due to the height of the sides of the aperture. Although the aperture through the insulating layer is so small as to be very difficult to find for alignment purposes during the fabrication process, even when using high-power microscopes, the elongated slots 26 and 28, which may be 3 mils in length, are easily located so that the location of the aperture may be easily determined.

Although preferred embodiments of the invention have been described in detail, it is to be understood that various changes, substitutions and alterations can be made therein without departing from the spirit and scope of the invention as defined by the appended claims.

We claim:

1. The process for manufacturing a metal-semiconductor junction diode or the like which comprises:

(a) depositing a first insulating layer over the surface of a semiconductor substrate, (b) selectively removing a first elongated strip of the first insulating layer to expose an elongated area of the surface of the semiconductor substrate, (c) depositing a second insulating layer over the first insulating layer and over the exposed surface of the semiconductor substrate, (d) selectively removing a second elongated strip of the second insulating layer which intersects the first elongated strip to expose an area of the surface of the semiconductor substrate defined generally by the intersection of the opening resulting from the removal of the two elongated strips, and (e) depositing a metal film on the exposed portion of the semiconductor substrate to form a metal-semiconductor junction.

2. The process for manufacturing a metal-semiconductor junction diode or the like which comprises:

(a) depositing a first insulating layer over the surface of a semiconductor substrate, (b) selectively removing a first elongated strip of the first insulating layer by an etchant fluid to expose an elongated area of the surface of the semiconductor substrate, (c) depositing a second insulating layer over the first insulating layer and over the exposed surface of the semiconductor substrate, the second insulating layer having a rate of etch in a particular etchant fluid appreciably greater than the rate of etch of the first insulating layer, (d) selectively removing a second elongated strip of the second insulating layer which intersects the first elongated strip by said particular etchant fluid to expose an area of the surface of the semiconductor substrate defined generally by the intersection of the opening resulting from the removal of the two elongated strips, and (e) depositing a metal film on the exposed portion of the semiconductor substrate to form a metal-semiconductor junction.

3. The process defined in claim 2 wherein the first insulating layer is aluminum trioxide ($Al_2O_3$) and the second insulating layer is silicon dioxide ($SiO_2$).

4. The process defined in claim 2 wherein the first and second elongated strips are selectively removed by:

(f) applying a coat of photo-resist material over said first insulating layer, (g) exposing and developing said photo-resist material to remove an elongated strip of said photo-resist material, thereby exposing an elongated strip of said first insulating layer, and (h) etching the exposed area of said first insulating layer with said etchant fluid which selectively attacks said first insulating layer and not the developed photo-resist material, thereby removing said first elongated strip.

(i) applying a coat of photo-resist material over said second insulating layer, (j) exposing and developing said photo-resist material to remove an elongated strip of said photo-resist material, thereby exposing an elongated strip of said second insulating layer, and (k) etching the exposed area of said second insulating layer with said etchant fluid which selectively attacks said second insulating layer and not the developed photo-resist material, thereby removing said second elongated strip.

5. The process defined in claim 2 wherein the metal film is deposited on the exposed portion of the semiconductor substrate by an evaporation and condensation process.

6. The process for manufacturing a metal-semiconductor junction diode or the like which comprises:

(a) depositing a first insulating layer of silicon dioxide ($SiO_2$) on the surface of a semiconductor substrate, (b) selectively removing a first elongated strip of the first layer to expose the surface of the substrate, (c) depositing a second insulating layer of silicon dioxide ($SiO_2$) over the first insulating layer and over the exposed surface of the substrate, (d) selectively removing a second elongated strip of the second insulating layer which intersects the first elongated strip to expose an area of the surface of the semiconductor substrate defined generally by the area common to the opening resulting from the removal of the two elongated strips, and (e) passing a metal body through the aperture into contact with the surface of the substrate to form a metal-semiconductor junction.

7. The process defined in claim 6 wherein the first and second elongated strips are selectively removed by first severally masking the respective layers with a photo-resist and then severally subjecting the substrate to an etchant fluid, the second elongated strip being removed by subjecting the substrate to the etchant fluid for the period of time necessary to remove a thickness of the oxide greater than the second layer but less than the combined thickness of the first and second layers.

8. The process for manufacturing a semiconductor device having a small aperture in a film covering a substrate which comprises:

(a) depositing a first layer over the surface of the substrate, (b) removing a small portion of the first layer to expose an area of the substrate, (c) depositing a second layer over the first layer and over the exposed surface of the substrate, the second layer having a rate of etch in a particular etching fluid appreciably greater than the rate of the first layer, and (d) selectively removing a portion of the second layer larger than the exposed area of the substrate by said particular etchant such that the area of the substrate exposed through the first layer will also be exposed through the second layer and the aperture formed through the two layers will be enlarged at the open end.

References Cited

UNITED STATES PATENTS

| | | | |
|---|---|---|---|
| 2,864,729 | 12/1958 | Seiler | 148—1.5 |
| 3,165,430 | 1/1965 | Hugle | 148—187 |
| 3,200,019 | 8/1965 | Scott | 148—187 XR |
| 3,275,910 | 9/1966 | Phillips | 148—187 |

HYLAND BIZOT, *Primary Examiner.*